(12) United States Patent
Baccini

(10) Patent No.: US 8,521,324 B2
(45) Date of Patent: Aug. 27, 2013

(54) AUTOMATIC STORE AND METHOD FOR STORING PLATES OF ELECTRONIC CIRCUITS

(71) Applicant: Andrea Baccini, Mignagola di Carbonera (IT)

(72) Inventor: Andrea Baccini, Mignagola di Carbonera (IT)

(73) Assignee: Applied Materials Italia S.R.L., San Biagio di Callalta Treviso (IT)

( * ) Notice: Subject to any disclaimer, the term of this patent is extended or adjusted under 35 U.S.C. 154(b) by 0 days.

(21) Appl. No.: 13/757,204

(22) Filed: Feb. 1, 2013

(65) Prior Publication Data

US 2013/0140137 A1 Jun. 6, 2013

Related U.S. Application Data

(63) Continuation of application No. 12/256,744, filed on Oct. 23, 2008, now Pat. No. 8,386,071.

(30) Foreign Application Priority Data

Oct. 24, 2007 (IT) .................................. UD07A0196

(51) Int. Cl.
G06F 7/00 (2006.01)
(52) U.S. Cl.
USPC ....................................... 700/223; 198/465.1
(58) Field of Classification Search
USPC .......................................................... 700/223
See application file for complete search history.

(56) References Cited

U.S. PATENT DOCUMENTS

| | | | |
|---|---|---|---|
| 4,354,667 | A | 10/1982 | Svendsen |
| 4,468,165 | A | 8/1984 | Kawasaki |
| 4,511,122 | A | 4/1985 | Svendsen |
| 4,570,245 | A | 2/1986 | Thigpen |
| 4,895,242 | A | 1/1990 | Michel |
| 5,197,716 | A | 3/1993 | Zibilich, Jr. et al. |
| 5,419,457 | A | 5/1995 | Ross et al. |
| 5,624,207 | A | 4/1997 | Berges |
| 5,655,753 | A | 8/1997 | Berges et al. |

(Continued)

FOREIGN PATENT DOCUMENTS

| JP | 63-67215 | 3/1988 |
|---|---|---|
| JP | 7-285611 A | 10/1995 |

(Continued)

OTHER PUBLICATIONS

Official Action dated Aug. 28, 2012 for Japanese Patent Application No. 2010-530571.

*Primary Examiner* — Gene Crawford
*Assistant Examiner* — Kyle Logan
(74) *Attorney, Agent, or Firm* — Patterson & Sheridan, LLP

(57) ABSTRACT

An automatic store and a method for storing plates of electronic circuits comprising a feed belt that feeds the plates of electronic circuits along a first plane (F); collection boxes positioned along at least one side of the feed belt and in which the plates of electronic circuits fed by the feed belt are grouped together according to quality classes; and one or more clearing stations disposed in cooperation with the feed belt in order to position the plates of electronic circuits in the respective collection boxes. The store comprises at least two rows of collection boxes disposed along at least one side of the feed belt, and a movement unit associated with the collection boxes to discharge the filled collection boxes and to position new collection boxes to be filled.

13 Claims, 4 Drawing Sheets

(56) References Cited

U.S. PATENT DOCUMENTS

| | | |
|---|---|---|
| 5,680,936 A | 10/1997 | Beers |
| 5,902,072 A | 5/1999 | Berges |
| 6,024,344 A | 2/2000 | Buckley et al. |
| 6,026,967 A | 2/2000 | Isaacs et al. |
| 6,058,072 A | 5/2000 | Abraham |
| 6,070,857 A | 6/2000 | Dragsund et al. |
| 6,082,710 A | 7/2000 | Dragsund et al. |
| 6,135,697 A | 10/2000 | Isaacs et al. |
| 6,276,509 B1 | 8/2001 | Schuster et al. |
| 6,431,369 B1 | 8/2002 | Boller et al. |
| 6,468,021 B1 | 10/2002 | Bonora et al. |
| 6,561,339 B1 | 5/2003 | Olson et al. |
| 6,561,360 B1 | 5/2003 | Kalm et al. |
| 6,575,306 B1 | 6/2003 | Schuster et al. |
| 6,907,982 B2 | 6/2005 | Olson et al. |
| 7,080,739 B2 | 7/2006 | Guy et al. |
| 7,310,287 B2 | 12/2007 | Ray et al. |
| 2003/0223822 A1 | 12/2003 | Oldervoll et al. |
| 2004/0016623 A1* | 1/2004 | Olson et al. .............. 198/465.1 |
| 2004/0074561 A1 | 4/2004 | Boller et al. |
| 2004/0197185 A1 | 10/2004 | Dorner |
| 2004/0238326 A1 | 12/2004 | Lichti |
| 2005/0169713 A1 | 8/2005 | Luc et al. |
| 2006/0103371 A1 | 5/2006 | Manz |
| 2007/0056885 A1 | 3/2007 | Enenkel et al. |
| 2007/0116544 A1 | 5/2007 | Ragessi et al. |
| 2007/0134078 A1 | 6/2007 | Rogers et al. |
| 2008/0279636 A1 | 11/2008 | Ray et al. |
| 2009/0324338 A1 | 12/2009 | Thompson et al. |

FOREIGN PATENT DOCUMENTS

| | | |
|---|---|---|
| JP | 11-94759 A | 4/1999 |
| JP | 11-188314 A | 7/1999 |
| JP | 11-309419 A | 11/1999 |
| JP | 2002-166234 A | 6/2002 |
| JP | 2003-507171 A | 2/2003 |
| JP | 2004-250137 A | 9/2004 |
| WO | 2007/051070 A2 | 5/2007 |

* cited by examiner

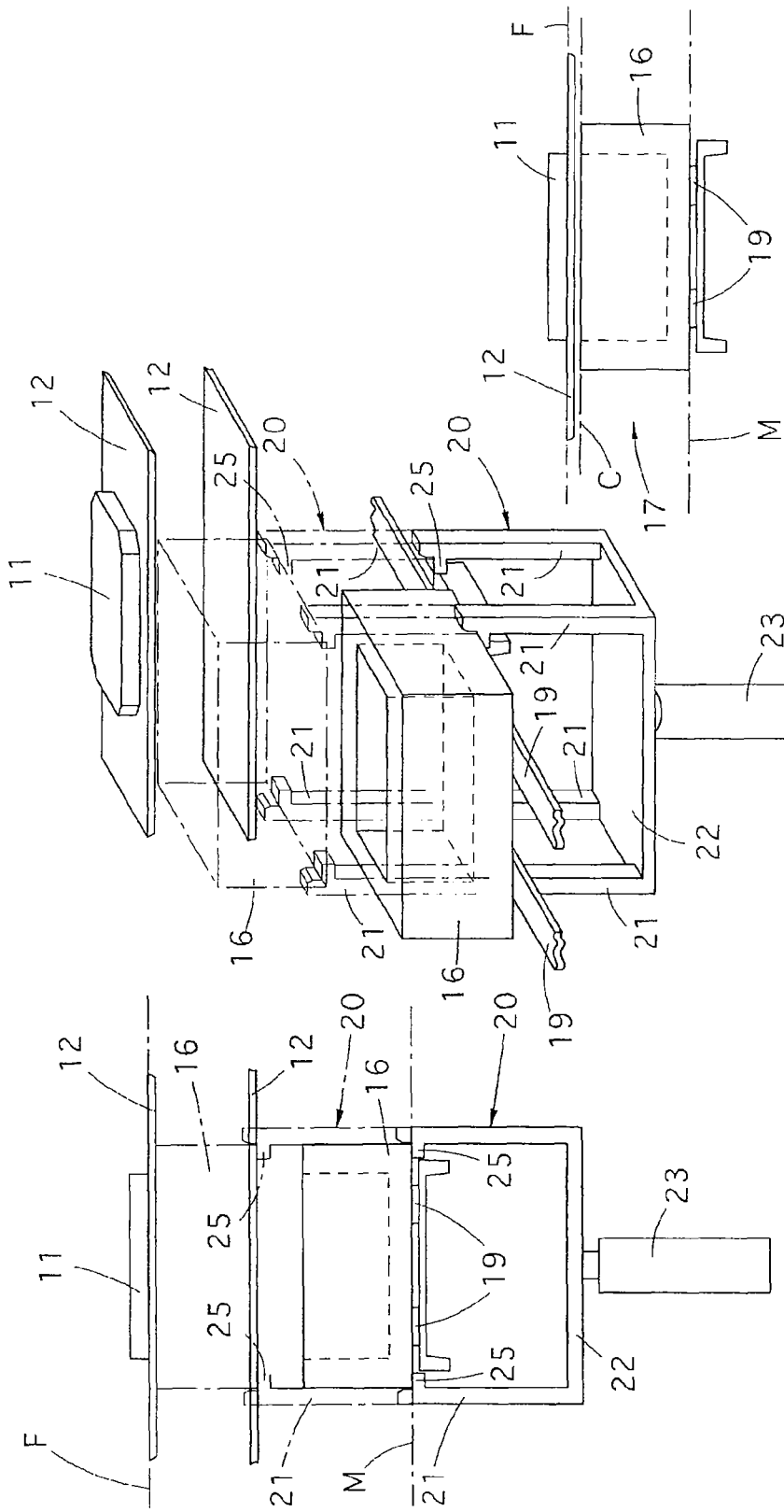

AUTOMATIC STORE AND METHOD FOR STORING PLATES OF ELECTRONIC CIRCUITS

CROSS-REFERENCE TO RELATED APPLICATIONS

This application is a continuation of co-pending U.S. Ser. No. 12/256,744, filed Oct. 23, 2008, and claims priority to the Italian Patent Application No. UD2007A000196, filed Oct. 24, 2007, which are both herein incorporated by reference.

BACKGROUND OF THE INVENTION

Field of the Invention

The present invention concerns an automatic store and the relative method for storing plates of electronic circuits of defined size and small thickness. A typical but non-exclusive example are the plates of electronic circuits used, in particular but not exclusively, for making photovoltaic cells or green tape, exiting from a quality test performed with a specific testing unit. In particular, the store according to the present invention allows to store the plates separately, classifying them according to quality classes.

Automatic stores are known, disposed downstream of a testing unit and able to automatically store a determinate type of plate of electronic circuits in specific collection baskets, separating them according to the relative quality classes.

This type of known stores normally provide a conveyor belt which transports the plates exiting from the testing unit, and one or more clearing stations disposed above the conveyor belt and able to position the plates in the respective collection baskets according to the specific quality class they belong to.

The collection baskets are normally disposed in a single row at the two sides of the conveyor belt and are substantially co-planar with the latter.

The baskets are moved by a movement member, which is disposed substantially on the same plane as the conveyor belt of the photovoltaic cells.

The movement member is able both to position the empty collection baskets at the side of the conveyor belt and also to discharge the collection baskets when they are completely full of plates.

This known solution provides that both the positioning of the baskets and their discharge is effected at the side of and on the same plane as the conveyor belt.

Therefore, with the known solution it is necessary to have periodic operating interruptions of the conveyor belt and of the clearing stations, to wait for one or more full baskets are completely discharged before being able to position, in the same collection positions with respect to the conveyor belt, corresponding empty baskets to be filled.

Purpose of the present invention is to achieve an automatic store for a testing unit for plates of electronic circuits which allows a substantially continuous functioning of the conveyor belt and the clearing stations for the plates, even at the same time as one or more collection baskets are replaced.

The Applicant has devised, tested and embodied the present invention to overcome the shortcomings of the state of the art and to obtain these and other purposes and advantages.

SUMMARY OF THE INVENTION

The present invention is set forth and characterized in the independent claims, while the dependent claims describe other characteristics of the invention or variants to the main inventive idea.

An automatic store for storing plates of electronic circuits, in particular but not exclusively photovoltaic cells, green tape or other, according to the present invention comprises:

feed means able to feed the plates exiting from the testing unit along a first plane;

collection means able to be positioned along at least one side of the feed means and in which the plates moved by the feed means are grouped together according to quality classes; and one or more clearing stations disposed in cooperation with the feed means and able to position the plates in the respective collection means.

In accordance with the above purpose, the automatic store comprises at least two rows of collection means disposed along at least one side of the feed means, so that when a collection means of the first row is full, it is discharged by relative movement means, and the clearing stations continue to position the plates in a corresponding collection means of the second row.

With the present invention, we therefore have the possibility of positioning the plates in the collection means substantially continuously, without needing to wait for the full collection means to be completely discharged in order to position the photovoltaic cells on a new one.

In this way, the positioning of the plates and the discharge of the completely full collection means are substantially optimized, thus increasing productivity.

Advantageously, the movement means is disposed on a second plane, different from and not co-planar with the first plane, and is able to move the collection means on said second plane, to position them in a desired manner with respect to the feed means, or to discharge them from the store.

With this solution we therefore have the photovoltaic cells that are fed on a first plane, whereas the collection means are moved on a second plane, different from the first.

The disposition on different planes of the feed means with respect to the movement means is such as to allow the free movement of the collection means without interfering either with the other collection means in the loading condition, or with the clearing stations, or with the feed means.

According to a variant, the movement means comprises a plurality of transverse belts, each disposed on the second plane transverse to and below the rows of collection means disposed at the side of the feed means.

According to another variant, the movement means comprises one or more positioning members able to move the collection means between the second plane and the first plane. Advantageously, the positioning members are conformed in such a manner that, when they support relative collection means keeping it in correspondence with the first plane, they allow to move other collection means along the second plane, also below the collection means kept on the first plane.

In this way, while some of the collection means are on the first plane in a lateral position with respect to the feed means in order to receive the specific plates, other collection means can be simultaneously moved on the second plane to effect discharges or new positionings, without needing to operationally interrupt the feed means.

Furthermore, the movement means, lying on the second plane, can include segments that pass physically above or below the feed means, so that the positioning of the collection means can take place on one side, while their discharge can take place on the opposite side with respect to the feed means.

This solution allows to optimize the movement of the collection means with respect to the clearing of the plates, and possibly limit the overall bulk of the store.

BRIEF DESCRIPTION OF THE DRAWINGS

These and other characteristics of the present invention will become apparent from the following description of a preferential form of embodiment, given as a non-restrictive example with reference to the attached drawings wherein:

FIG. 4 shows an enlarged detail of the automatic store in FIG. 1;

FIG. 5 is a three-dimensional view of the enlarged detail in FIG. 4;

FIG. 6 shows a variant of the automatic store in FIG. 1.

DETAILED DESCRIPTION OF A PREFERENTIAL FORM OF EMBODIMENT

Figure 1:
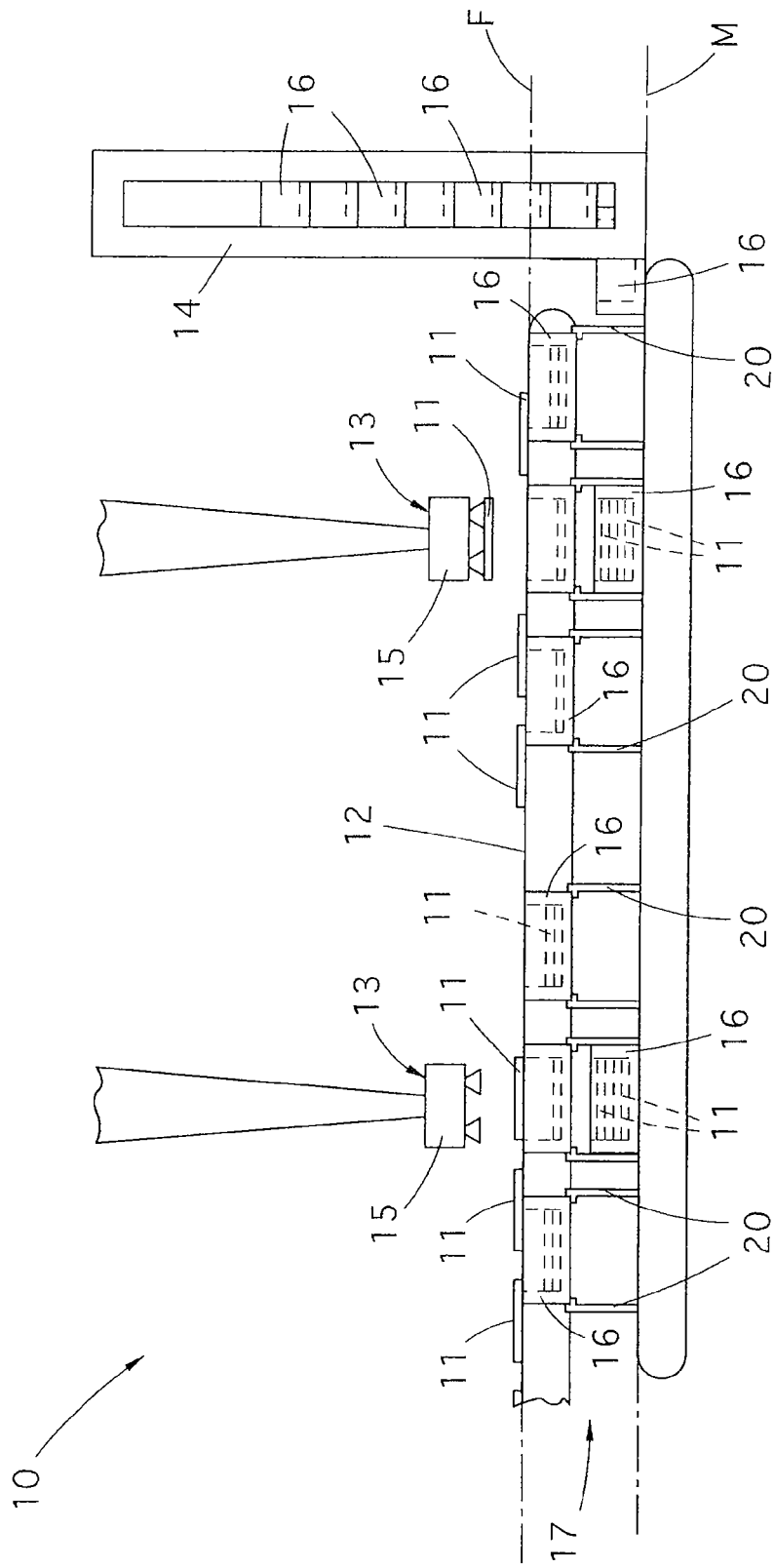
FIG. 1 is a lateral view of an automatic store for storing plates of electronic circuits according to the present invention.
Figure 2:
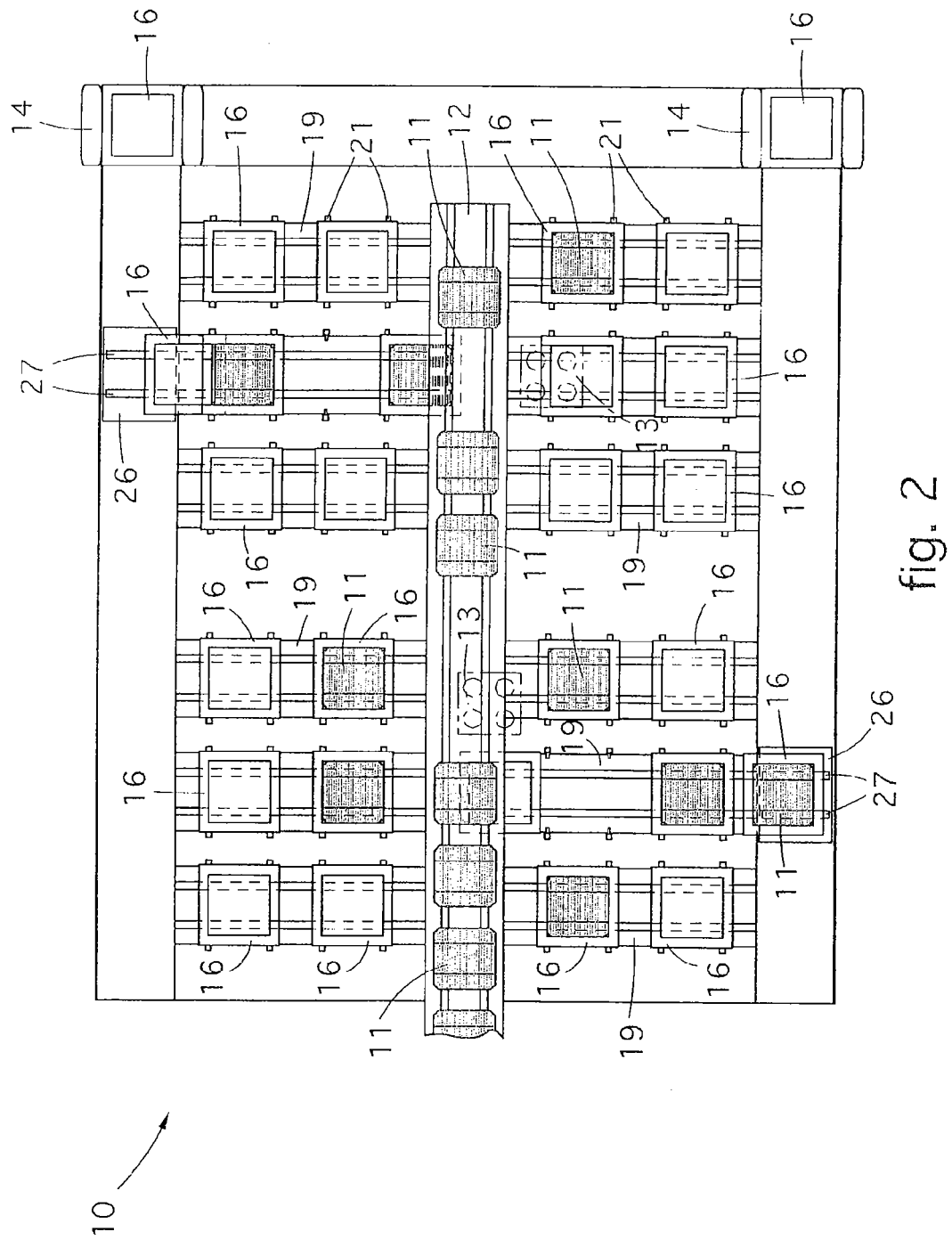
FIG. 2 is a view from above of the automatic store in FIG. 1.

With reference to the embodiment shown in FIGS. 1 and 2, an automatic store 10 is schematically shown, for storing plates of electronic circuits 11, for example photovoltaic cells, silicon-based wafers, green tape or others.

The store 10 comprises at least a feed belt 12 defining a feed plane F, and on which are positioned the plates 11 exiting from a testing unit or station, of a substantially known type and not shown in the drawings, to feed them into the automatic store 10. The testing unit or station is disposed upstream and in line with the automatic store 10.

In particular, the testing station verifies the production quality of the individual plates 11, associating with each of them a relative quality class, according to which they will be specifically stored afterwards.

The automatic store 10 comprises a plurality of collection boxes 16 disposed in two parallel rows and provided at the two sides of the feed belt 12.

The collection boxes 16 are normally disposed in a first loading position where they lie substantially on the feed plane F.

According to a variant, the collection boxes 16 disposed in their first loading position lie on a relative loading plane C substantially co-planar and below the feed plane F.

In each of the collection boxes 16 specific plates 11 are able to be loaded, according to their relative quality class.

Each row comprises a determinate number of collection boxes 16 chosen according to the number of quality classes provided.

In this way, when a collection box 16 disposed in the first row is completely filled, the plates 11 of the same quality class are loaded onto the corresponding collection box 16 of the second row, substantially with no break in continuity.

The store 10 is also provided with two feed turrets 14 for the collection boxes 16, in which the collection boxes 16 are stacked and are progressively released to replace those completely filled by the plates 11.

According to a variant, the feed turrets 14 are not provided, and the collection boxes 16 are fed and discharged in line with previous and subsequent work stations, without being stacked.

The automatic store 10 also comprises one or more clearing stations 13, in this case two, disposed above the feed belt 12, and provided with a suction cup manipulator 15 which picks up the plates 11 from the feed belt 12 and positions them in the relative collection boxes 16, in both the first and second row.

Each clearing station 13 in this case is of the robotized type, for example of the type described in the European patent application EP-A-1768174 in the name of the present Applicant.

Advantageously, each clearing station 13 is functionally connected to the testing station in order to be able to recognize the specific quality class of the individual plates 11.

A movement unit 17 for the collection boxes 16 is also part of the automatic store 10 according to the invention; it is disposed on a movement plane M substantially parallel and in this case below the feed plane F on which the feed belt 12 lies.

In the solution where the collection boxes 16 lie on the loading plane C, the movement plane M is below both the feed plane F and also below the loading plane C.

The movement unit 17 comprises a plurality of transverse belts 19, each disposed on the movement plane M transversely to and below the rows of collection boxes 16 disposed in their first loading position, at the side of the feed belt 12.

The transverse belts 19 allow to transport the new collection boxes 16 or the full collection boxes 16, on the movement plane M, and hence below the collection boxes 16 which are on the feed plane F, or on the loading plane C.

In correspondence with each of the collection boxes 16 that are on the feed plane F or loading plane C, the movement unit 17 comprises a positioning member 20.

Each positioning member 20 allows to move each collection box 16 vertically, in order to position it between the first loading position, in which it lies substantially on the feed plane F, or loading plane C, and is suitable to be filled with the plates 11, and a second transport position, lowered, in which it lies substantially on the movement plane M and is transported by the transverse belts 19.

In particular, each positioning member 20 comprises four liftable arms 21 disposed in pairs at the side of the relative transverse belt 19.

The four liftable arms 21 are connected at the lower part by a lifting plate 22, which is disposed in any case under the transverse belt 19 and is in turn moved by a linear actuator 23.

The movement of the liftable arms is shown schematically in Lines of dashes in FIGS. 4 and 5.

Each liftable arm 21 comprises a lifting bracket 25 able to cooperate with the bottom of a relative collection box 16 so as to function as a support for the collection box 16 during the movement between the two positions of loading and transport.

The disposition of the four liftable arms 21 at the side of the transverse belt 19 is wide enough to allow the free movement of a collection box 16, new or filled, along the transverse belt 19 without interfering with the liftable arms 21 and/or with the possible collection boxes 16 kept in their first loading position.

In particular, in the second transport position of the collection boxes 16, the lifting brackets 25 are slightly below the movement plane M so as not to interfere with the movement of the collection boxes 16.

The movement unit 17 also comprises two transport sliders 26 lying on the movement plane M, mobile substantially parallel to the feed belt 12, and disposed on opposite sides at the ends of the transverse belts 19.

In this way, the collection boxes 16 transported by the transverse belts 19 are unloaded onto, or arrive from, the transport sliders 26.

Each transport slider 26 has at least one end which cooperates with the exit of a relative feed turret 14.

in this way, when a new collection box 16 is fed from the feed turret 14, or from the line, the collection box 16 is disposed on the relative transport slider 26.

In this solution, each transport slider 26 comprises relative belts 27 that translate the collection boxes 16 transported by the transport slider 26 towards the relative transverse belt 19, to replace the full collection boxes 16.

Figure 3:
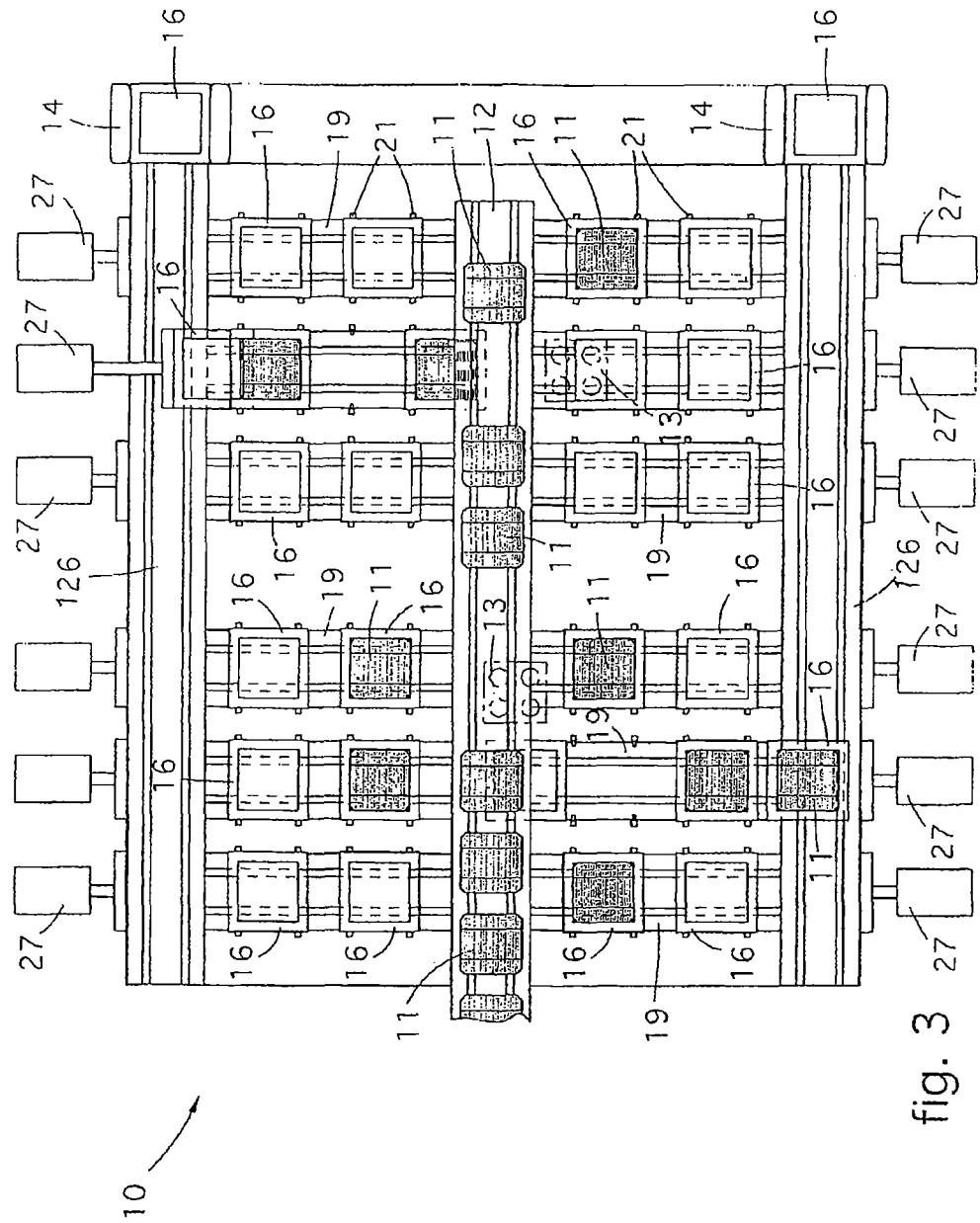
FIG. 3 shows a variant of FIG. 2.

With reference to the variant in FIG. 3, the movement unit 17 also comprises two transport belts 126 lying on the movement plane M, facing substantially parallel to the feed belt 12, and able to connect the ends of the transverse belts 19 from opposite sides.

In this way, the collection boxes 16 transported by the transverse belts 19 are unloaded onto, or arrive from, the transport belts 126.

Each transport belt 126 has at least one end that cooperates with the exit of a relative feed turret 14.

In this way, when a new collection box 16 is fed from the feed turret 14, or from the line, the collection box 16 is disposed on the relative transport belt 126.

In this solution, outside the transport belts 126, the movement unit 17 comprises a plurality of thrusters 127 which thrust the new collection boxes 16 transiting on the transport belts 126 towards the relative transverse belt 19, to replace the full collection boxes 16.

The automatic store 10 according to the present invention functions as follows.

Firstly, all the empty collection boxes 16 are kept by the relative positioning members 20 in their first loading position, so as to define the two rows at the two sides of the feed belt 12.

The plates 11 fed by the feed belt 12 are progressively picked up by the clearing stations 13 and disposed in the relative collection boxes 16 of the first row, according to the specific quality class.

Once a collection box 16 of the first row has been filled, the plates of the same quality class are loaded onto the relative collection box 16 of the second row.

Simultaneously, the positioning member 20 relating to the full collection box 16 moves the latter vertically so as to take it to its second transport position.

At this point, the relative transverse belt 19 transports the full collection box 16 under the other collection boxes 16, until it reaches one of the two transport sliders 26.

During these movements and transport, the clearing stations 13 continue to pick up the plates 11 fed by the feed belt 12 so as to load them into the relative collection boxes 16 of the first or second row.

The vertical movement and the activation of the transverse belt 19 command a new collection box 16 to be released by one of the two feed turrets 14.

Then the transport sliders 26 are activated, on the one side, to discharge the full collection box 16 and, on the other side, to transport the new collection box 16 into correspondence with the relative transverse belt 19.

In this condition, the belts 27 of the slider 26 translate the new collection box 16 onto the relative transverse belt 19, which moves it under the other collection boxes 16 in the loading position until it reaches the relative positioning member 20.

At this point, the positioning member 20 lifts the new collection box 16 to take it from its second transport position to its first loading position.

It is clear, however, that modifications and/or additions of parts may be made to the automatic store 10 as described heretofore, without departing from the field and scope of the present invention.

For example, it comes within the field of the present invention to provide that, as shown in FIG. 6, the movement unit 17 is not provided with the positioning member 20.

In this alternative solution, the collection boxes 16 are always disposed on two rows per side with respect to the feed belt 12, and are kept constantly on the loading plane C under the feed plane F, and moved on the movement plane M, once filled.

To prevent interference between the collection boxes 16, the movement of the collection boxes 16 of the first row can be carried out under the feed belt 12, while the collection boxes 16 of the second row can be moved on the opposite side towards the transport belts 126.

According to some variants the feed belts 12, transverse belts 19 and/or transport belts can be selectively moved continuously, step-wise, or at constant or variable speed, according to specific operating requirements.

According to another variant, the plates 11 are transported, picked up and replaced in pairs.

It also comes within the field of the present invention to provide a second movement plane and/or a second feed plane.

It is also clear that, although the present invention has been described with reference to some specific examples, a person of skill in the art shall certainly be able to achieve many other equivalent forms of automatic store and storage method for plates of electronic circuits, having the characteristics as set forth in the claims and hence all coming within the field of protection defined thereby.

The invention claimed is:

1. An apparatus for storing plates, comprising:
a belt disposed along a first plane;
a plurality of collection devices, when in a loading position, disposed in a first row along at least one side of the belt and in a second row adjacent to the first row;
one or more clearing stations disposed above the first plane; and
a movement unit disposed within a second plane at a vertical distance below the first plane, wherein the movement unit comprises:
a plurality of transverse belts, each disposed within a second plane,
wherein each transverse belts is disposed transversely from the first and second rows of the collection devices.

2. The apparatus of claim 1, wherein the movement unit further comprises one or more positioning members.

3. The apparatus of claim 2, wherein each positioning member comprises one or more liftable arms.

4. The apparatus of claim 3, wherein each liftable arm comprises a lifting bracket.

5. The apparatus of claim 3, wherein the liftable arms are disposed in a widened position with respect to the transverse belt.

6. The apparatus of claim 1, further comprises at least a feed turret.

7. The apparatus of claim 1, wherein the movement unit further comprises a plurality of translation belts.

8. The apparatus of claim 1, wherein the movement unit further comprises a transport slider disposed at each end of the transverse belts.

9. The apparatus of claim 1, wherein the movement unit further comprises at least a transport belt disposed transversely to the transverse belts.

10. A method for storing plates, comprising:
feeding the plates along a first plane by a belt;
loading the plates into a plurality of collection devices according to quality classes by one or more clearing stations disposed above the first plane, wherein the collection devices, when in a loading position, are disposed in one or more rows aligned along at least one side of the belt; and transferring filled and unfilled collection devices using a plurality of transverse belts that are each disposed within a second plane, wherein each transverse belts is disposed transversely from the rows of the collection devices.

11. The method of claim 10, wherein the transverse belts move the collection devices on the second plane to position the collection devices on the belt and to discharge the collection devices.

12. The method of claim 11, further comprising moving the collection devices between the first plane and the second plane by one or more positioning members.

13. The method of claim 10, further comprising maintaining the collection devices on a third plane disposed between the first plane and the second plane by the transverse belts.

* * * * *

UNITED STATES PATENT AND TRADEMARK OFFICE
CERTIFICATE OF CORRECTION

| | |
|---|---|
| PATENT NO. | : 8,521,324 B2 |
| APPLICATION NO. | : 13/757204 |
| DATED | : August 27, 2013 |
| INVENTOR(S) | : Baccini |

It is certified that error appears in the above-identified patent and that said Letters Patent is hereby corrected as shown below:

Title Page, Item [71]:

Please delete "Andrea Baccini, Mignagola di Carbonera (IT)" and insert --Applied Materials Italia S.R.L., San Biagio di Callalta (IT)-- therefor;

In the Drawings:

Drawing sheet 3 of 4, Fig. 3, please delete "27" and insert --127-- therefor;

In the Specification:

Column 4, Line 65, please delete "in" and insert --In-- therefor.

Signed and Sealed this
Twenty-fifth Day of February, 2014

Michelle K. Lee
*Deputy Director of the United States Patent and Trademark Office*